United States Patent [19]

Schuermann

[11] 4,057,765
[45] Nov. 8, 1977

[54] VARIABLE AMPLIFIER FOR RF INPUT STAGE

[75] Inventor: Josef H. Schuermann, Oberhummel, Germany

[73] Assignee: Texas Instruments Deutschland GmbH, Freising, Germany

[21] Appl. No.: 706,404

[22] Filed: June 19, 1976

[30] Foreign Application Priority Data

July 25, 1975 Germany .............................. 2533355

[51] Int. Cl.² ............................................. H03G 3/30
[52] U.S. Cl. .................................... 330/279; 330/284; 330/145; 330/302
[58] Field of Search ................... 330/29, 35, 138, 145; 325/319, 410, 414

[56] References Cited
U.S. PATENT DOCUMENTS

| 3,428,910 | 2/1969 | Webb ..................................... 330/29 |
| 3,525,050 | 8/1970 | Wolf et al. ......................... 330/35 X |
| 3,624,561 | 11/1971 | Tongue .............................. 330/29 X |

Primary Examiner—James B. Mullins
Attorney, Agent, or Firm—Harold Levine; Richard L. Donaldson; James T. Comfort

[57] ABSTRACT

A variable gain RF input amplifier having an improved cross modulation characteristic using a field effect transistor. About the first 10 db of signal attenuation is effected by an AGC voltage applied to the transistor, following which supplementary attenuation is provided by an increasing reverse bias applied to a PIN-diode in the RF signal input path to the transistor, the diode bias being derived from the source circuit of the transistor.

19 Claims, 6 Drawing Figures

VARIABLE AMPLIFIER FOR RF INPUT STAGE

This invention relates to a variable gain amplifier for RF-input stages comprising a field-effect transistor to which a control voltage is delivered. In one know circuit of this type, which is used for example in television tuners or in RF-stages of communications equipment, gain is attenuated by means of the control voltage applied to a control electrode of the field effect transistor. The drain current of the field effect transistor is reduced by the attenuation process. Attenuation is carried out in order to improve the large-signal behaviour and, in particular, the cross-modulation strength of the amplifier and the following stages.

An amplifier circuit functioning with a bipolar high-current transistor is also known, in which attenuation is effected by means of a PIN diode. This PIN diode acts as an attenuator which attenuates the RF-signals arriving at the high-current transistor. This circuit is also used for improving cross-modulation strength. Considerable outlay in terms of circuitry is involved in obtaining the necessary bias for the PIN diode.

Although the cross-modulation strength curve obtainable by means of conventional amplifiers shows a generally increasing characteristic with increasing gain attenuation, it shows distinct dips where the cross-modulation strength is poor.

The object of the present invention is to design a variable amplifier of the kind referred to above in such a way that cross-modulation strength is considerably improved.

According to the invention, this object is achieved by virtue of the fact that a variable diode is arranged in the connection between the input electrode of the field effect transistor and the amplifier input, being biased in such a way that, when regulation begins, the field effect transistor is first attenuated by about 10 dB before regulation through the diode begins. In an amplifier according to the invention, an RF-signal delivered to the amplifier input is initially attenuated solely by means of the control voltage delivered to the control electrode of the field effect transistor, i.e. this initial attenuation is not influenced by the variable diode. It is only after attenuation by about 10 dB has taken place that the variable diode becomes active and weakens the input signal, resulting in further attenuation together with the attenuation produced by the control voltage. In the amplifier according to the invention, cross-modulation strength is distinctly increased. A distinct increase is obtained even in those regions where the cross-modulation strength curve of conventional circuit showed pronounced dips.

The variable diode is preferably a PIN diode which, in advantageous embodiments of the invention, is connected between the amplifier input and an input filter preceding the field effect transistor or between that input filter and the input electrode of the field effect transistor.

In order to predetermine the starting point of regulation by the diode, the bias of the variable diode is, in an advantageous embodiment of the invention, tapped from a source resistor of the field effect transistor and delivered to the anode of the variable diode through an RF-choke. The field effect transistor may with advantage be an MOS-field effect transistor, operated as a common source circuit, and having two control electrodes, to the first of which the control voltage is delivered and of which the second is connected to the amplifier input through the variable diode. The field effect transistor may also be an MOS-field effect transistor, operated as a common gate circuit, and having two control electrodes, to the first of which the control voltage is delivered and of which the second is at a fixed bias, the source electrode being connected to the amplifier input through the variable diode.

According to another aspect of the invention, the field effect transistor is a barrier-layer field effect transistor operated as a common gate circuit, and having two control electrodes, to the first of which the control voltage is delivered and of which the second is at a fixed bias, the source electrode being connected to the amplifier input through the variable diode.

In order to ensure that, throughout the entire control range, an optimum control voltage is applied to the input electrode of the field effect transistor, a clamp diode is connected to the source electrode of the field effect transistor in one advantageous embodiment of the invention, holding the voltage at the source electrode of the field effect transistor firmly at a predetermined value towards the end of the control range. The clamp diode is with advantage biased in such a way that the predetermined voltage value, at which it holds the source voltage of the field effect transistor, is equal to or greater than the pinch-off voltage of the control electrode of the field effect transistor to which the control voltage is applied.

Embodiments of the invention will be described by way of example with reference to the accompanying drawings, wherein.

Figure 1:
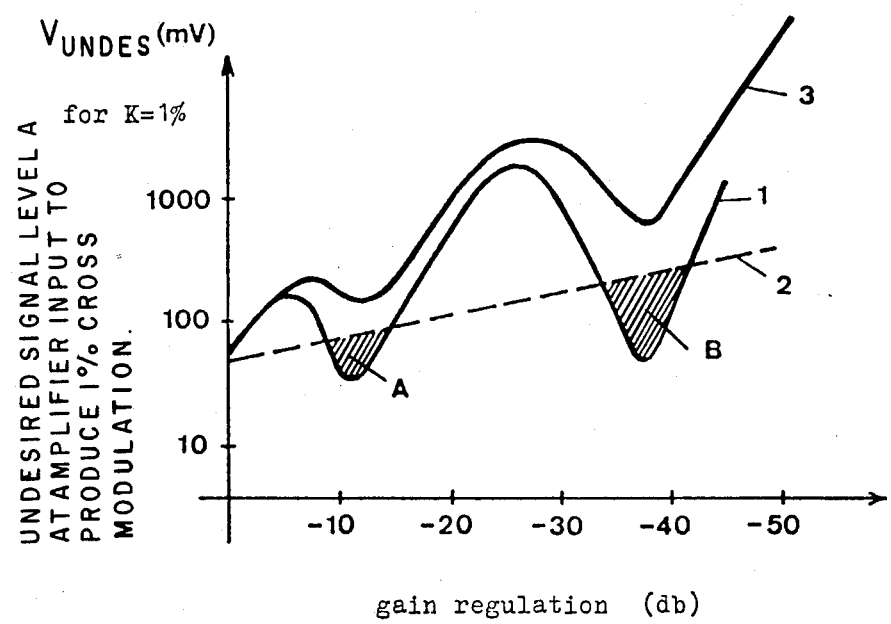
FIG. 1 is a graph showing the cross-modulation strength of a conventional amplifier and of an amplifier designed in accordance with the invention, as a function of the gain control.

In FIG. 1, the curve 1 represents a typical cross-modulation strength of a conventional variable amplifier equipped with a field effect transistor. In this graph, the noise voltage $V_{UNDES}$ for a cross-modulation factor K=1% is plotted against the gain control. It can be seen that, although the undesired signal voltage increases with increasing attenuation, as indicated by the chain line 2, the curve 1 includes dips A and B where the cross-modulation strength is poor. By means of the amplifier to be described, it is possible to obtain a cross-modulation strength, such as indicated by curve 3, which represents a distinct improvement over curve 1.

Figure 6:
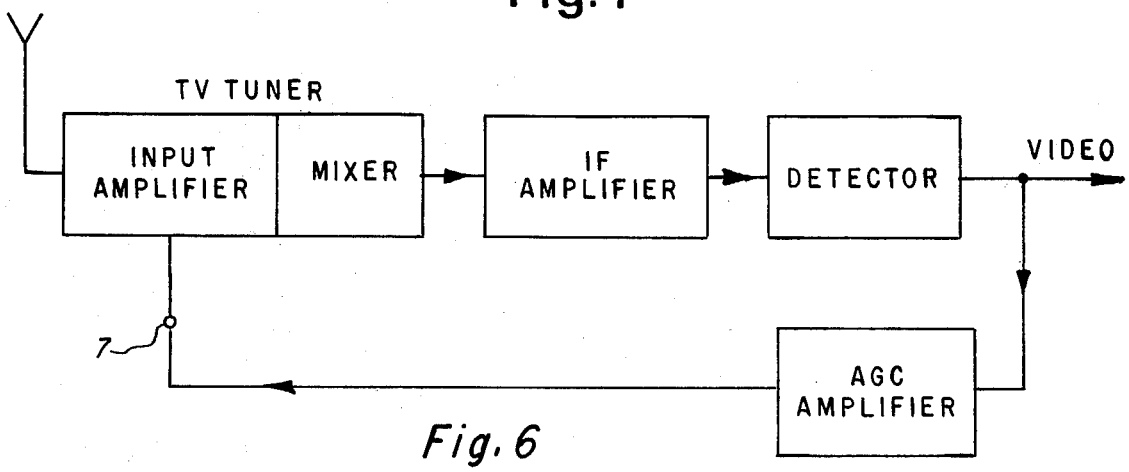
FIG. 6 illustrates a circuit for generating an AGC voltage suitable for use in conjunction with an amplifier according to the invention.
Figure 2:
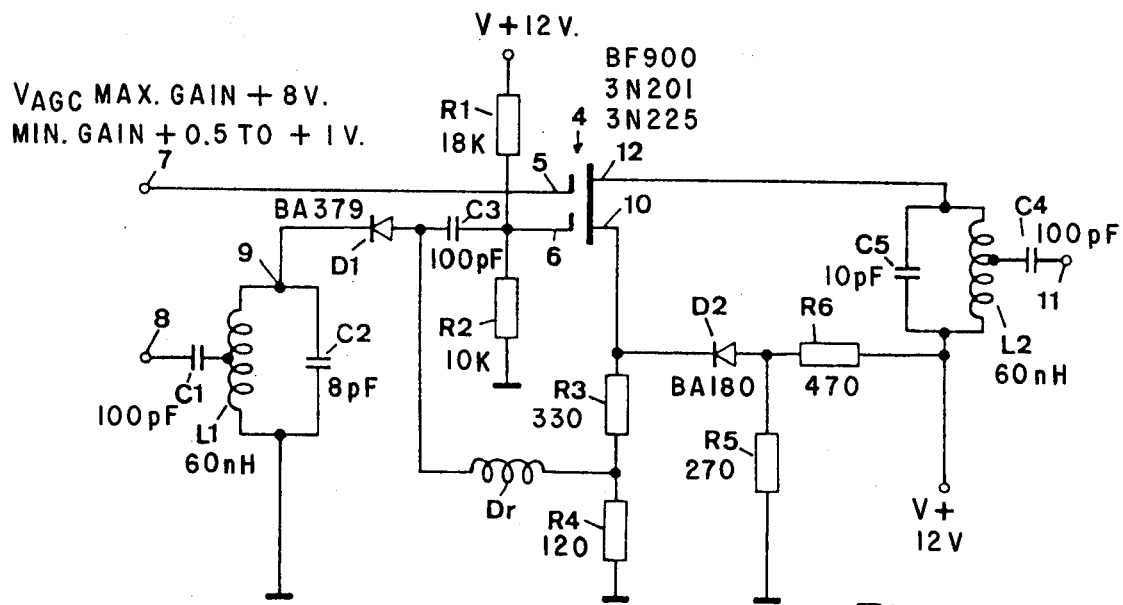
FIGS. 2 to 5 show exemplary embodiments of a variable amplifier according to the invention.

FIG. 2 shows a variable amplifier circuit which may be used, for example, in the tuner of a television receiver. This circuit contains, as its amplifying element, an MOS-field effect transistor 4 with two gate electrodes 5 and 6. The usual AGC control voltage, which attenuates gain by producing an increasing reduction in the drain current of the field effect transistor 4, is derived in conventional manner as illustrated by FIG. 6 delivered to the gate electrode 5 from the input 7.

The RF-signal to be amplified is delivered to the amplifier at the input 8 from which it passes through a coupling capacitor C1 to an input filter comprising the coil L1 and the capacitor C2. The cathode of a PIN diode D1 is connected to the output 9 of the input filter, the anode of this PIN diode D1 being connected through a coupling capacitor C3 to the gate electrode 6 of the field effect transistor 4. A potentiometer R1, R2 is connected between a supply voltage V+ and ground, the junction of R1, R2 being connected to the gate electrode 6 to apply a bias voltage thereto.

The source resistor of the field effect transistor 4 comprises two individual resistors R3 and R4. An RF-decoupling choke Dr is arranged between the connecting point of the two resistors R3 and R4 and the connecting point between the diode D1 and the coupling capacitor C3. A bias can be applied to the anode of the PIN diode D1 through this choke. The cathode of a clamp diode D2 is connected to the source electrode 10 of the field effect transistor 4, A bias is applied to the anode of this clamp diode D2, from the tap of a voltage divider comprising resistors R5, R6 connected between V+ and ground.

The output signal of the amplifier is tapped through a coupling capacitor C4 from the coil L2 of an output circuit which is formed by this coil L2 and by a capacitor C5 and which is connected between the drain electrode 12 of the field effect transistor 4 and the positive terminal of the voltage source V+.

In describing the mode of operation of the circuit shown in FIG. 2, it is assumed that an RF-signal is delivered to the input 8 with such an amplitude that attenuation begins through the control voltage delivered to the input 7. When attenuation begins, a certain, relatively large drain current initially flows through the field effect transistor 4. This current produces in the resistor R4 a voltage drop which keeps the PIN diode D1 in the conductive state through the choke Dr. At the beginning of the control range, therefore, the PIN diode D1 does not have any influence upon attenuation. Apart from the control effect of the control voltage applied to the gate electrode 5, it is only the voltage drop across the source resistor R3, R4, which is dependent upon the drain current, which has an attenuating effect in this part of the control range.

In order to utilise the full control range of the transistor 4, a control voltage extending from positive values to negative values would have to be applied to the source electrode 5. Since a control voltage with this range is not available in normal tuner circuits, it is necessary to make a circuit modification which ensures that the full control range of the field effect transistor can be traversed with an exclusively positive control voltage. This may be accomplished for example by increasing the voltage at the source electrode 10 of the field effect transistor 4 by feeding a current into the source resistor R3, R4.

The value of the source resistor R3, R4 has to meet the following requirements: on the one hand, the value of this resistor should be high enough to ensure that a steep regulating effect is obtained through the voltage difference between the gate electrode 6 and the source electrode 10; on the other hand, it should not be so high that the current fed in to increase the source voltage produces an excessive voltage drop across the source resistor R3, R4 which would intolerably limit gain where only a limited supply voltage is available. To enable the value of the source resistor R3, R4 to be made sufficiently high without, at the same time, causing an unfavourable, excessive voltage drop across it, the voltage at the source electrode 10 is held firmly at a predetermined value by means of the clamp diode D2. If this value is fixed for example at 2.0 volts, the voltage at the anode of the clamp diode D2 is adjusted to a value of 2.7 volts by means of the resistors R5 and R6. If, in the course of attenuation, the drain current of the field effect transistor 4 decreases and if the source voltage falls below 2.0 volts, the clamp diode D2 becomes conductive and delivers to the source resistor R3, R4 just enough current to ensure that the voltage value of 2 volts is maintained at the source electrode 10.

In general, it is possible, with an exclusively positive control voltage at the gate electrode 5 of the field effect transistor 4, to utilise the entire control range, provided that the voltage maintained by the clamp diode D2 at the source electrode 10 satisfies the requirement that, when the field effect transistor 4 is completely attenuated, the voltage value maintained at the source resistor is equal to or greater than the pinch-off voltage of the gate electrode 5 of the field effect transistor 4.

If, in the course of attenuation, the drain current of the field effect transistor 4 decreases, the voltage drop across the resistor 4 falls below the threshold voltage of the PIN diode which is about 0.7 volt. By adjusting the ratio of the values of the resistors R3 and R4, this fall can be made to occur after an attenuation of about 10 dB. The PIN diode D1 then becomes highly resistive and acts like a current-controlled resistor which weakens the RF-signal. The PIN diode D1 now also contributes towards attenuating the gain.

In the circuit described above, therefore, the field effect transistor 4 is initially responsible for attenuation, the clamp diode D2 providing for a favourable working range of the field effect transistor, enabling a distinct increase in the cross-modulation strength to be obtained in the vicinity of the dip A of FIG. 1. The PIN diode D1 then begins to develop its regulating effect after an attenuation of about 10 dB, which considerably improves cross-modulation strength in the vicinity of the dip B of FIG. 1. The amplifier with this control characteristic then produces the characteristic represented by curve 2 in FIG. 1 for the cross-modulation strength.

Figure 3:
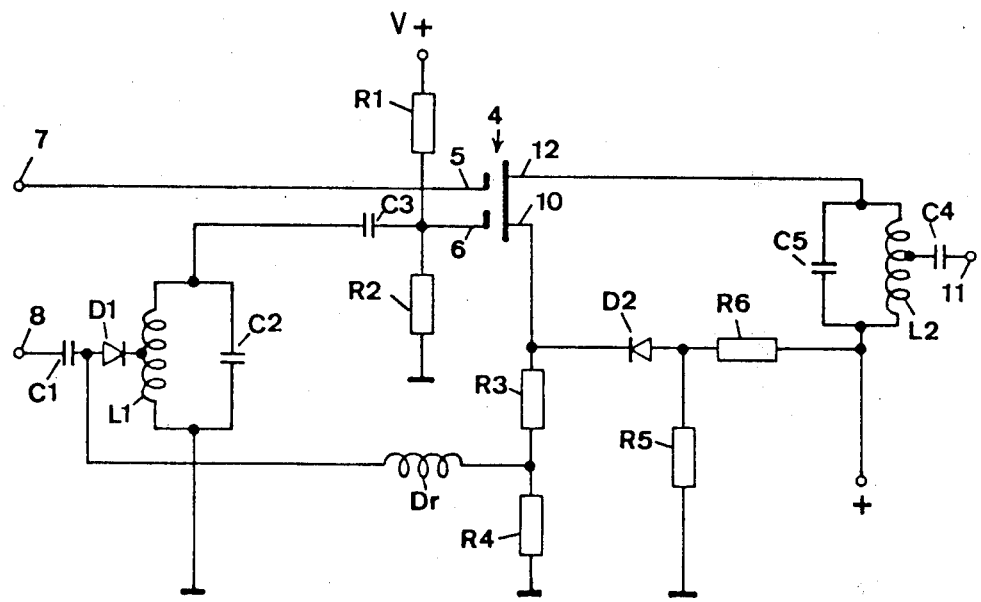

FIG. 3 shows another embodiment of the invention which differs from the embodiment illustrated in FIG. 2 solely in the fact that the PIN diode D1 precedes the input filter of the coil L1 and the capacitor C2. So far as its regulating effect is concerned, this embodiment behaves in exactly the same way as the circuit illustrated in FIG. 2.

Figure 4:
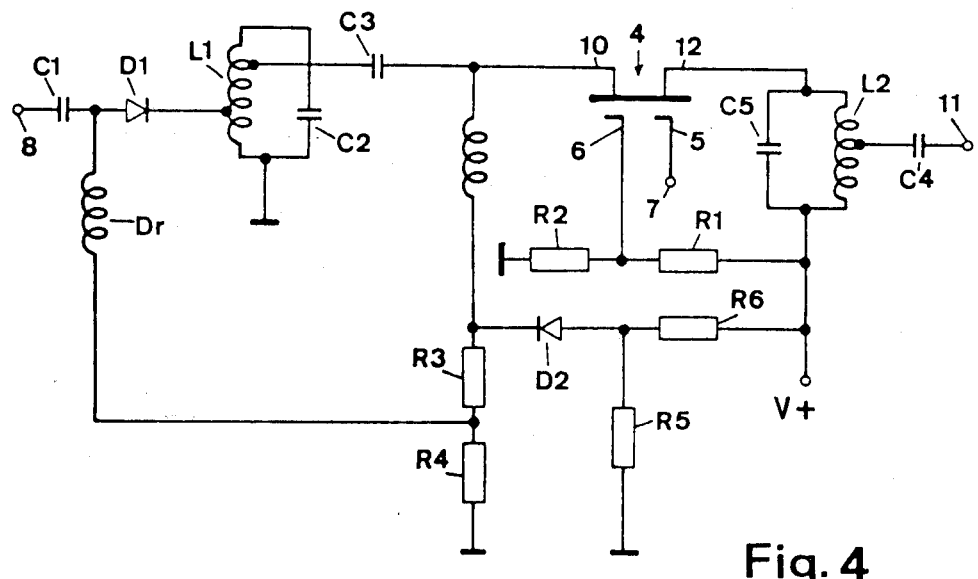

Whereas, in the embodiments described above, the MOS-field effect transistor was operated as a common source circuit, the MOS-field effect transistor 4 in the embodiment illustrated in FIG. 4 operates as a common gate circuit. In this embodiment, the input electrode of the field effect transistor is the source electrode 10 to which the RF signal is delivered. As in the embodiments described above, attenuation is initially obtained also in this circuit by the field effect transistor 4, whilst the regulating effect of the PIN diode D1 only begins after an attenuation of about 10 dB by the field effect transistor.

Figure 5:
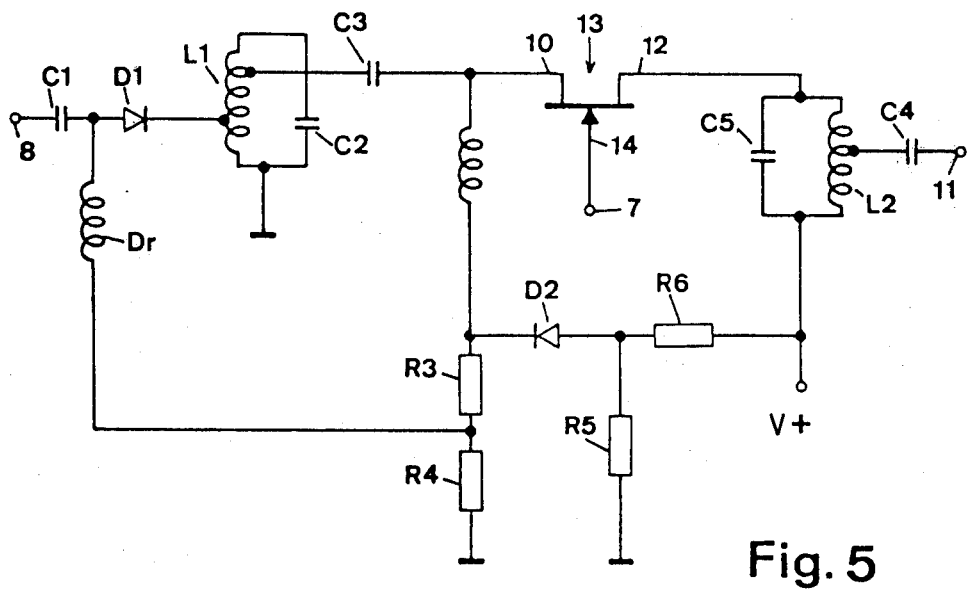

In the embodiment of the invention illustrated in FIG. 5, the MOS-field effect transistor is replaced by a barrier-layer field effect transistor (MESFET) 13 to whose signal gate electrode 14 the control voltage is applied. This barrier-layer field effect transistor 13 is operated as a common gate circuit. Its source electrode 10 receives the RF-signal. So far as its regulating effect is concerned, this circuit also behaves in exactly the same way as the circuits described above.

The variable amplifier described above has the advantage of minimal outlay on components, and when used in RF-input stages produces a significant improvement in large-signal behaviour. It enables the control range to be effectively utilised, which is of advantage particularly in cases where only a limited operating voltage is avaiable.

Suitable components for constructing a circuit as shown in FIG. 2 are as follows:

| | | | |
|---|---|---|---|
| R1 | 18kohm | C1 | 100pF |
| R2 | 10kohm | C2 | 8pF |
| R3 | 330ohm | C3 | 100pF |
| R4 | 120ohm | C4 | 100pF |
| R5 | 270ohm | C5 | 10pF |
| R6 | 470ohm | L1 | nH |
| D1 | BA379 | L2 | nH |
| D2 | BA180 | | |
| Transistor 4 - BF900 | | | |
| V + 12 volts | | | |
| AGC voltage at terminal 7 | - maximum gain | + 8 volts | |
| | minimum gain | + 0.5 to + 1 | |

What is claimed is:

1. A variable gain r.f. input amplifier having a signal input terminal, field effect transistor means including a signal input electrode and a control electrode for receiving a control voltage for adjusting the attenuation of the transistor means, current controlled resistor means consisting of a single semiconductor diode serially connected in a signal path between said amplifier signal input terminal and the input electrode of said field effect transistor means, and diode biasing circuit means including source resistor means for said field effect transistor means having an intermediate tap connected to said semiconductor diode for biasing said diode in response to decreasing conduction of said field effect transistor means from a condition providing low attenuation to a condition providing substantial attenuation in said signal path only after the gain of said field effect transistor means has been reduced by about 10 dB in response to said control voltage.

2. An amplifier according to claim 1, wherein said diode is a PIN diode.

3. An amplifier according to claim 1, wherein said signal path includes RF signal input filter means.

4. An amplifier according to claim 1, wherein said bias circuit means includes r.f. impedance means connecting the intermediate tap of said source resistor means to said semiconductor diode.

5. An amplifier according to claim 1, wherein said field effect transistor means comprises an insulated gate field effect transistor having two gate electrodes and connected in common source configuration, wherein said control electrode is a first one of said gate electrodes and the signal input electrode is the second gate electrode.

6. An amplifier according to claim 2, wherein said field effect transistor means comprises an insulated gate field effect transistor having two gate electrodes and connected in common gate configuration, and wherein said control electrode comprises a first one of said gate electrodes and said signal input electrode comprises the source of said field effect transistor.

7. An amplifier according to claim 1, wherein said field effect transistor means comprises a barrier-layer field effect transistor having a gate electrode providing said control electrode, and wherein the source of said transistor provides said signal input electrode.

8. In a braodcast receiver including automatic gain control circuit means for generating an automatic gain control signal, a variable gain RF input amplifier for attenuating an RF signal over a predetermined control range having a signal input terminal and including field effect transistor means including a signal input electrode and a control electrode connected to said automatic gain control circuit means for receiving said control voltage for adjusting the attenuation of said field effect transistor means, a signal path between said signal input terminal and said signal input electrode and including a PIN diode, said field effect transistor means including source resistor means having an intermediate tap, RF impedance means connecting said tap to the anode of said PIN diode to reverse bias said diode only after attenuation of about 10 dB of an RF signal applied to said signal input terminal has been effected by said field effect transistor means in response to a said automatic gain control signal applied to said control electrode.

9. An RF amplifier according to claim 8, wherein said field effect transistor means comprises an insulated gate field effect transistor having two gate electrodes, and wherein said control electrode comprises one of said gate electrodes.

10. An amplifier according to claim 8, further including a diode clamp circuit connected to the source electrode of said field effect transistor means for holding the source electrode voltage at a predetermined value near an end of the control range of said transistor means.

11. An amplifier according to claim 10, including means for biasing said diode clamp circuit means to hold the source voltage of said field effect transistor means at a value equal to or greater than the pinchoff voltage of said control electrode.

12. An amplifier according to claim 8, wherein said signal path includes an RF signal input filter.

13. In a broadcast receiver including circuit means for generating a unipolar AGC signal: a variable gain RF input amplifier including a field effect transistor including a signal input electrode, and a gate electrode connected to said AGC circuit for receiving said unipolar AGC signal; a signal path between said signal input terminal and said signal input electrode including a PIN diode; source resistor means for said field effect transistor including an intermediate tap; d.c. connection means providing substantail RF impedance connecting said tap to said diode for applying a reverse bias to said diode only after source-drain current of said transistor in response to an RF signal input at said signal input terminal has been reduced by an amount corresponding to an attenuation of about 10 dB of said RF signal input in response to said AGC signal applied to said gate electrode; and a diode clamp circuit connected to the source electrode of said field effect transistor for biasing the source voltage of said transistor at a value at least equal to the pinchoff voltage of said gate electrode of the field effect transistor.

14. An RF amplifier circuit according to claim 13, wherein said signal path includes an RF signal input filter.

15. An amplifier according to claim 14, wherein said field effect transistor comprises an insulated gate field effect transistor having two gate electrodes and wherein a first of said gate electrodes is connected to said AGC circuit for receiving said AGC signal and the second gate electrode provides said signal input electrode of said transistor.

16. An amplifier according to claim 14, wherein said field effect transistor is an insulated gate field effect transistor having two gate electrodes, wherein one of said gate electrodes is connected to said AGC circuit for receiving said AGC signal and wherein the source electrode of said field effect transistor comprises said input signal electrode.

17. An amplifier according to claim 14, wherein said field effect transistor is a barrier-layer field effect transistor, and wherein the source electrode of said transistor provides said signal input electrode.

18. A variable gain r.f. input amplifier having a signal input terminal, field effect transistor means including a signal input electrode and a control electrode for receiving a control voltage for adjusting the attenuation of the transistor means, current controlled resistor means connected in a signal path between said amplifier input signal terminal and the input electrode of said field effect transistor means, and biasing circuit means for said current controlled resistor means responsive to decreasing conduction of said field effect transistor means to change the resistance of said resistor means for providing substantial attentuation in said signal input path only after the gain of said field effect transistor means has been reduced by about 10 dB in response to said control voltage, and a diode clamp circuit connected to the source electrode of said field effect transistor means for holding the source electrode voltage at a predetermined value at an end of the control range of said transistor means.

19. An amplifier according to claim 18, including means for biasing said clamp diode means to hold the source voltage of said field effect transistor means at a value equal to or greater than the pinchoff voltage of said control electrode.

* * * * *